(12) United States Patent
Heuer et al.

(10) Patent No.: US 6,268,068 B1
(45) Date of Patent: Jul. 31, 2001

(54) LOW STRESS POLYSILICON FILM AND METHOD FOR PRODUCING SAME

(75) Inventors: Arthur H. Heuer, Cleveland; Harold Kahn, Lakewood; Jie Yang, Cleveland, all of OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 09/260,168

(22) Filed: Mar. 1, 1999

Related U.S. Application Data

(60) Provisional application No. 60/103,163, filed on Oct. 6, 1998.

(51) Int. Cl.⁷ .................................................. B32B 15/01
(52) U.S. Cl. .......................... 428/620; 428/636; 428/641; 428/446; 428/450
(58) Field of Search .................................... 428/620, 636, 428/641, 446, 450; 438/488

(56) References Cited

U.S. PATENT DOCUMENTS

| | | | |
|---|---|---|---|
| 3,856,647 | 12/1974 | Blachman | 204/192.7 |
| 3,900,597 | 8/1975 | Chruma et al. | 438/488 |
| 4,240,196 | 12/1980 | Jacobs et al. | 438/593 |
| 4,251,571 | 2/1981 | Garbarino et al. | 438/587 |
| 4,270,960 | 6/1981 | Bollen et al. | 438/489 |
| 4,631,804 | 12/1986 | Roy | 438/404 |
| 4,742,020 | 5/1988 | Roy | 438/149 |
| 4,897,360 | 1/1990 | Guckel et al. | 216/2 |
| 5,059,556 | 10/1991 | Wilcoxen | 438/52 |
| 5,110,757 | 5/1992 | Arst et al. | 438/489 |
| 5,225,951 | 7/1993 | Kira et al. | 360/321 |
| 5,233,459 | 8/1993 | Bozler et al. | 359/230 |
| 5,287,081 | 2/1994 | Kinard et al. | 338/24 |
| 5,298,436 * | 3/1994 | Radosevich et al. | 438/396 |
| 5,303,595 | 4/1994 | Shoji et al. | 73/728 |
| 5,319,479 | 6/1994 | Yamada et al. | 349/138 |
| 5,332,689 | 7/1994 | Sandhu et al. | 438/491 |
| 5,393,351 | 2/1995 | Kinard et al. | |
| 5,633,552 | 5/1997 | Lee et al. | |
| 5,753,134 | 5/1998 | Biebl | |
| 5,863,659 * | 1/1999 | Kobayshi et al. | 428/446 |

FOREIGN PATENT DOCUMENTS

798770A2 * 10/1997 (EP) .

OTHER PUBLICATIONS

Kahn et al., "Mechanical Properties of Thick, Surface Micromachined Polysilicon Films," Proc. IEEE Micro Electro Mech. Syst. Workshop, MEMS 96, pp 343–348, 1996 (no month).

Kakinuma, "Comprehensive Interpretation of the Preferred Orientation of Vapor–Phase Grown Polycrystalline Silicon Films," *J. Vac. Sci. Technol.* A, vol. 13, No. 5, pp. 2310–2317, 1995 (no month).

Guckel et al. "Fine–Grained Polysilicon Films with Built–In Tensile Strain," *IEEE Transactions on Electron Devices*, vol. 35, No. 6, 1988, pp 800–803 (no month).

(List continued on next page.)

*Primary Examiner*—Deborah Jones
*Assistant Examiner*—Stephen Stein
(74) *Attorney, Agent, or Firm*—Fay, Sharpe, Fagan, Minnich & McKee, LLP

(57) ABSTRACT

Multi-layer assemblies of polysilicon thin films having predetermined stress characteristics and techniques for forming such assemblies are disclosed. In particular, a multi-layer assembly of polysilicon thin film may be produced that has a stress level of zero, or substantially so. The multi-layer assemblies comprise at least one constituent thin film having a tensile stress and at least one constituent thin film having a compressive stress. The thin films forming the multi-layer assemblies may be disposed immediately adjacent to one another without the use of intermediate layers between the thin films.

16 Claims, 5 Drawing Sheets

OTHER PUBLICATIONS

P. Joubert et al., "The Effect of Low Pressure on the Structure of LPCVD Polycrystalline Silicon Films," *J. Electrochem. Soc.*, vol. 134 No. 10, pp 2541–2544, 1987 (no month).

Huang et al., "Investigation of texture and stress in undoped polysilicon films," MRS Symposium Proceedings, vol. 182, pp. 201–206, 1990 (no month).

Yu et al., "Stress and microstructural evolution of LPCVD polysilicon thin films during high temperature annealing," MRS Symposium Proceedings, vol. 441, pp. 403–408, 1997 (no month).

Guckel et al., "The application of fine-grained, tensile polysilicon to mechanically resonant transducers," *Sensors and Actuators*, vol. A21–A23, pp 346–351, 1990 (no month).

Furtsch et al., "Comprehensive study of processing parameters influencing the stress and stress gradient of thick poly–silicon layers," *SPIE Proceedings*, vol. 3223, pp 130–141, 1997 (no month).

Kirsten et al., "Deposition of thick doped polysilicon films with low stress in an epitaxial reactor for surface micromachining applications," *Thin Solid Films* 259 pp 181–187 (1995) (no month).

Lange et al., "Thick polycrystalline silicon for surface–micromechanical applications: depositions, structuring and mechanical characterization," *Sensors and Actuators*, A 54 pp 674–678 (1996) (no month).

Furtsch et al., "Texture and stress profile in thick polysilicon films suitable for fabrication of microstructures," *Thin Solid Films* 296 pp 177–180 (1997) (no month).

\* cited by examiner

LOW STRESS POLYSILICON FILM AND METHOD FOR PRODUCING SAME

CROSS REFERENCES TO RELATED APPLICATIONS

This application claims priority from U.S. Provisional Application Ser. No. 60/103,163, filed Oct. 6, 1998.

This invention was made with government support under Grant No. NASA 342-9405 awarded by NASA. The government has certain rights in this invention.

BACKGROUND OF THE INVENTION

Polysilicon is one of the most widely used structural materials for microelectromechanical systems and devices. However, when deposited by low-pressure chemical vapor deposition (LPCVD) techniques, polysilicon films typically display high residual stresses and often stress gradients as well. These stresses, particularly when compressive, may cause released devices to bend and buckle, altering their original shapes and degrading their performances. While tensile stresses may promote planarity in doubly clamped designs, such stresses also increase stiffness and cause deformation of asymmetric features. Zero-stress polysilicon thin film structures would be optimal for many applications.

Prior artisans have attempted to produce thin silicon films with reduced stress levels. U.S. Pat. No. 5,753,134 entitled "Method for Producing a Layer With Reduced Mechanical Stresses" to Biebl, is directed to a method for producing a silicon layer having a reduced overall stress value, the layer being composed of two silicon sublayers. The first sublayer and the second sublayer are matched to one another such that the stresses in the two layers substantially compensate each other, and in effect, cancel each other out. However, Biebl requires that one or more auxiliary layers of silicon dioxide be provided between the sublayers. Those auxiliary layers require additional manufacturing or processing operations. Although satisfactory in some respects, a need still exists for an improved multi-layer polysilicon assembly and technique for forming, and particularly for an assembly that does not require the use of intermediate or auxiliary layers.

In addition, a disadvantage often associated with polysilicon films deposited by chemical vapor deposition techniques, pertains to the resulting relatively rough surface of the deposited film. Although approaches are known for producing films having relatively smooth finishes, typically, additional processing steps are necessary or critical process control schemes must be implemented. Accordingly, a need remains for a technique for producing films and multi-layer assemblies of such films having relatively smooth surfaces.

SUMMARY OF THE INVENTION

The present invention achieves the foregoing objectives and provides in a first aspect, a multi-layer thin film assembly comprising a first thin film including polysilicon, and a second thin film also comprising polysilicon. The first thin film has a devitrified microstructure and an internal tensile stress. The second thin film has a predominantly columnar microstructure and an internal compressive stress. The first and second thin films are disposed immediately adjacent to one another to form the multi-layer assembly, thereby avoiding the use of an intermediate layer between the first and second thin films. In addition, the resulting films have exceptionally smooth surfaces.

In yet another aspect of the present invention, a multi-layer thin film assembly is provided that includes at least three thin films, each having a thickness within a certain range, and each having a particular microstructure. The thin films are arranged such that they are immediately adjacent to at least one of the other thin films.

The present invention also provides a method of forming a multi-layer thin film assembly comprising a plurality of polysilicon thin films. The method enables the multi-layer assembly to be formed with a selectively determinable stress characteristic. The method comprises forming a first polysilicon thin film that has either (i) a devitrified microstructure and an internal tensile stress, or (ii) a predominantly columnar microstructure and an internal compressive stress. The method further comprises forming a second polysilicon thin film immediately adjacent to the first polysilicon thin film. The second thin film has either (i) a predominantly columnar microstructure and an internal compressive stress, or (ii) a devitrified microstructure and an internal tensile stress. The arrangement of the films is selected so that the microstructure of the second thin film is different from the microstructure of the first thin film, such that if the first thin film is devitrified, the second thin film is predominantly columnar and vice versa.

Further scope of the applicability of the present invention will become apparent from the detailed description given hereinafter. It should, however, be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The following is a brief description of the drawings which are present for the purpose of illustrating the invention and not for purposes of limiting the invention.

DETAILED DESCRIPTION OF THE PREFERRED EMBODIMENTS

The present invention provides a multi-layer assembly of two or more layers of polysilicon thin films. At least one of the polysilicon thin films is devitrified and exhibits a residual tensile stress. In addition, at least one of the polysilicon thin films is predominantly columnar and exhibits a residual compressive stress. The layers of the multi-layer assembly are preferably arranged within the multi-layer assembly such that the stresses of the polysilicon thin films alternate with respect to each other across the thickness of the assembly. The term "devitrified" as used herein refers to a microstructure in which the material is deposited in a generally amorphous, vitreous, or non-crystalline state. After deposition, sites within the material begin to form organized, non-amorphous and generally crystalline regions. However, the deposition parameters and system variables associated with the present invention are such that the material devitrifies or alters its structure after deposition, either before completion of that layer or during subsequent processing. The term "predominantly columnar" refers to material that is deposited in a generally crystalline state, or readily transforms to a crystalline state immediately upon or after deposition.

Figure 1:
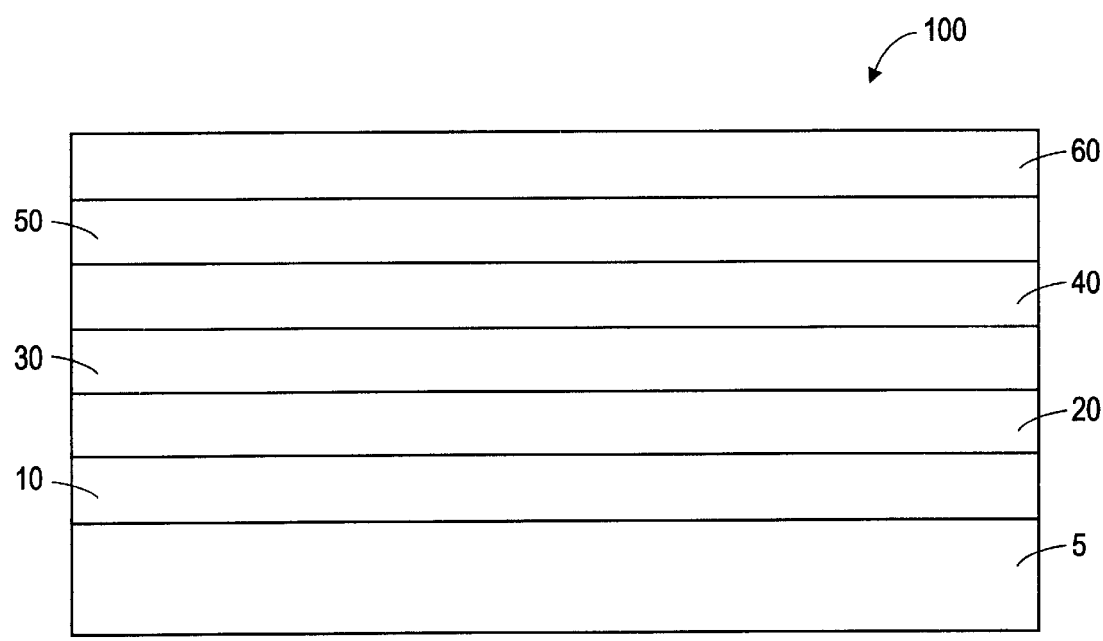
FIG. 1 is a schematic cross-sectional view of a preferred embodiment multi-layer polysilicon film in accordance with the present invention.

FIG. 1 is a schematic cross-sectional view of a preferred embodiment multi-layer polysilicon assembly 100 in accordance with the present invention. The multi-layer assembly 100 comprises a base or substrate 5, onto which are disposed a plurality of polysilicon thin films. A first polysilicon thin film 10 is deposited on the substrate 5 such that the thin film 10 is devitrified and has an inherent or residual tensile stress. A second polysilicon thin film 20 is deposited on the first devitrified thin film 10 such that the thin film 20 is predominantly columnar and has an inherent or residual compressive stress. A third polysilicon thin film 30 is deposited on the second polysilicon thin film 20 such that the thin film 30 is devitrified and has an inherent or residual tensile stress. A fourth polysilicon thin film 40 is deposited on the thin film 30 such that the thin film 40 is predominantly columnar and has an inherent or residual compressive stress. A fifth polysilicon thin film 50 is deposited on the fourth polysilicon thin film 40 such that the thin film 50 is devitrified and has an inherent or residual tensile stress. A sixth polysilicon thin film 60 is deposited on the thin film 50 such that the thin film 60 is predominantly columnar and has an inherent or residual compressive stress.

The arrangement of the thin films 10, 20, 30, 40, 50, and 60 may be reversed such that thin films 10, 30, and 50 have internal residual stresses that are compressive instead of tensile in nature. Similarly, in such an alternate arrangement, thin films 20, 40, and 60 have internal residual stresses that are tensile instead of compressive in nature.

The present invention provides a wide array of multi-layer thin film assemblies in addition to the six layer assembly depicted in FIG. 1. The present invention provides multi-layer assemblies having a number of thin films ranging from 2 up to 20 or more layers. The number of layers or thin films may be even or odd. However, as explained in greater detail below, it is preferable that the number of layers is odd in number, which offers the potential to control, and in particular to minimize, stress gradients.

One of the significant advantages of the present invention is that the various layers, e.g., 10 and 20, do not require intermediate or auxiliary layers disposed between them. That is, a first polysilicon thin film having either a residual inherent tensile or compressive stress, may be disposed immediately adjacent to another polysilicon thin film, i.e., a second film, having a residual inherent stress, different than that of the first film. This enables stacked assemblies to be formed with fewer processing steps and also enables stacked assemblies of shorter profile or height than if intermediate layers are included between one or more thin films. Yet another advantage of the present invention relates to etching. Typically, etching is much easier if there are no intermediate layers of composition different than the previously described primary layers.

The thickness or height of the multi-layer assemblies of the present invention varies depending upon the end use application. However, typical thicknesses for the resulting assemblies range from about 1 micron to about 10 microns. Similarly, the thickness of individual layers constituting the multi-layer assembly may span a relatively wide range. However, preferred thicknesses for the individual layers range from about 100 nm to about 1000 nm. As will be appreciated, the thickness of the multi-layer assembly is the sum of the thicknesses of the individual thin films.

In another aspect of the present invention, a technique is provided whereby a multi-layer assembly is provided that has a predetermined overall level and type of stress. The overall level and type of stress of the multi-layer assembly may be selectively obtained by controlling the stress characteristics and thickness of each individual thin film within the assembly. That is, by adjusting the thin film processing conditions during formation of each thin film, and by controlling the thickness of each thin film, desired stresses can be imparted to each of the individual thin films that form the multi-layer stacked assembly. And, therefore, the overall level and type of stress of the multi-layer assembly may be selectively produced. This technique is described in the examples herein. As will be appreciated, the overall type of stress, i.e. compressive or tensile, and the value or degree of such stress of the resulting multi-layer assemblies, is generally the sum of the individual stresses of each of the constituent layers of films forming the multi-layer assembly.

Another important and significant feature of the present invention relates to a remarkable discovery that polysilicon stacked assemblies having relatively smooth exterior surfaces can be produced. In accordance with the present invention, a polysilicon thin film having an exterior face with a surface finish roughness less than about 25 nm is provided (all surface roughness values expressed herein are root mean square, RMS, values). Ideally, preferred surface roughness is zero or near zero. However, it will be appreciated that perfectly smooth surfaces are not obtainable. In accordance with the present invention, a multi-layer assembly is produced having an outer face roughness value of 16.3 nm. Generally, surface roughness increases as the layer thickness increases. Thus, in forming a smooth face layer, it is preferred for such a layer to be relatively thin.

And, as described herein, layers deposited to have amorphous or devitrified microstructures generally produce smoother faces than layers having crystalline or predominantly columnar microstructures. Accordingly, low deposition temperatures, i.e. about 570° C. to about 580° C., are employed when depositing initial (bottom) and last (top) layers. This aspect is described in greater detail herein.

Table 1, set forth below, summarizes stress characteristics of single and multi-layer polysilicon thin films in accordance with the present invention, before and after annealing. This table summarizes a feature of the present invention, that multi-layer polysilicon films, produced in accordance with the present invention, are surprisingly stable in that upon being subjected to relatively high temperatures, their stress characteristics do not significantly change.

TABLE 1

Stress Characteristics of Single and Multi-Layer Polysilicon Films, Before and After Annealing

| No. of layers | Deposition temperature(s) (° C.) | Annealing temperature (° C.) for 1 hour in Nitrogen | Stress (MPa) (Tensile is Positive) |
| --- | --- | --- | --- |
| 1 | 550 | as-deposited | −201 |
|   |   | 615 | −123 |
|   |   | 615 (1 additional hour) | 184 |
| 1 | 570 | as-deposited | 189 |
|   |   | 615 | 265 |
|   |   | 615 (1 additional hour) | 264 |

TABLE 1-continued

Stress Characteristics of Single and Multi-Layer
Polysilicon Films, Before and After Annealing

| No. of layers | Deposition temperature(s) (° C.) | Annealing temperature (° C.) for 1 hour in Nitrogen | Stress (MPa) (Tensile is Positive) |
|---|---|---|---|
| 1 | 580 | as-deposited | 170 |
|   |     | 1000 | 27 |
| 1 | 615 | as-deposited | −200 |
|   |     | 800 | −140 |
|   |     | 1000 | −97 |
|   |     | 1100 | −28 |
| 6 | 580/610 | as-deposited | 25 |
|   |     | 800 | 28 |
|   |     | 1000 | −3 |
|   |     | 1100 | −19 |
| 8 | 580/615 | as-deposited | 3 |
|   |     | 800 | 15 |
|   |     | 1000 | 5 |
|   |     | 1100 | −10 |
| 8 | 550/615 | as-deposited | −100 |
|   |     | 615 | −46 |
|   |     | 615 (1 additional hour) | −40 |
| 9 | 570/615 | as-deposited | 14 |
|   |     | 800 | 52 |
|   |     | 1000 | −11 |
|   |     | 1100 | −18 |
| 9 | 570/615 | as-deposited | −17 |
|   |     | 800 | 57 |
|   |     | 1000 | 0 |
|   |     | 1100 | −9 |
| 9 | 615/570 | as-deposited | −21 |
|   |     | 800 | 30 |
|   |     | 1000 | −15 |
|   |     | 1100 | −20 |

Table 2, set fourth below, presents roughness measurements of a single layer of polysilicon deposited at 615° C., and a multi-layer polysilicon assembly comprising alternating layers of polysilicon, deposited at 580° C. and 615° C. All of these layers were deposited by LPCVD using silane. The surface roughness of the single layer was 70.7 nm, while the surface roughness of the outer most face of the exterior layer deposited at 615° C. was a surprisingly low 16.3 nm.

TABLE 2

Roughness Measurements

| No. of layers | Deposition temperature(s)(° C.) | RMS Roughness (nm) |
|---|---|---|
| 1 | 615 | 70.7 |
| 8 | 580/615 | 16.3 |

It is surprising and remarkable that the outer surface of the eight-layer assembly exhibited such a smooth finish, particularly as compared to the single layer. It will be appreciated that the microstructure of the single layer, and of the outermost layer of the multi-layer assembly were generally the same-predominently columnar, since both layers were deposited at the same deposition temperature, 615° C.

Although the multi-layer thin film assemblies of the present invention can be formed via numerous processs, it is preferred that they be formed by chemical vapor deposition techniques.

Chemical vapor deposition (CVD) or thermal CVD is the deposition of atoms or molecules from a chemical vapor precursor, which contains the film material to be deposited. Chemical vapor precursors include chlorides such as titanium tetrachloride, $TiCl_4$; fluorides such as tungsten hexafluoride, $WF_6$; hydrides such as silane, $SiH_4$ carbonyls such as nickel carbonyl, $Ni(CO)_4$; and many others. Besides silane ($SiH_4$), polysilicon layers can be produced by CVD of dichlorosilane ($SiCl_2H_2$), or silicon tetrachloride ($SiCl_4$). Any of these gases can be used alone or with hydrogen. Decomposition of the vapor is preferably by chemical reduction or thermal decomposition. The reduction is normally accomplished by hydrogen at an elevated temperature. Some vapors, such as the carbonyls, can be thermally decomposed at relatively low temperatures. The deposited material may react with gaseous species such as oxygen, with a hydrocarbon gas such as methane or ammonia, or with a codeposited species to give compounds such as oxides, nitrides, carbides, and borides.

One such CVD chemical reaction is that of silane:

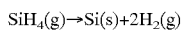

$$SiH_4(g) \rightarrow Si(s) + 2H_2(g)$$

which is a decomposition reaction.

CVD reactions are most often produced at ambient pressure in a freely flowing system. The gas flow, mixing, and stratification in the reactor chamber can be important to the deposition process. CVD can also be performed at low pressures (LPCVD) and in ultrahigh vacuum (UHVCVD) where the gas flow is molecular. The gas flow in a CVD reactor is very sensitive to reactor design, fixturing, substrate geometry, and the number of substrates in the reactor, i.e., reactor loading.

The CVD process is accomplished using either a hot-wall or a cold-wall reactor as known in the art. In the former, the whole chamber is heated and thus a large volume of processing gases is heated as well as the substrate. In the latter, the substrate or substrate fixture is heated, often by inductive heating. This heats the gas locally.

The gas flow over the substrate surface establishes a boundary layer across which precursor species must diffuse in order to reach the surface and deposit. In the cold-wall reactor configuration, the boundary layer defines the temperature gradient in the vapor in the vicinity of the substrate. This boundary layer can vary in thickness and turbulence, depending on the direction of gas flow. Direct impingement of the gas on the surface reduces the boundary layer thickness and increases the temperature gradient, whereas stagnant flow regions give much thicker boundary layers.

Each heating technique has its advantages and disadvantages, and changing from one technique to another may involve significant changes in the process variables. The cold-wall reactor is most often used in small size systems. The hot-wall reactor, by contrast, is most often used in large volume production reactors.

CVD processing can be accompanied by volatile hot reaction by-products such as HCl or HF, which, along with unused precursor gases, must be removed from the exhaust gas stream. This is done by scrubbing the chemicals from the gas using water to dissolve soluble products or by burning the precursor gases to form oxides.

In many cases, the deposited material can retain some of the original chemical constituents, such as hydrogen and silicon from the deposition from silane, or chlorine and tungsten from the deposition from $WCl_6$. This can be beneficial or detrimental. For example, the retention of hydrogen and silicon allows the deposition of amorphous silicon, a-Si:H, which is used in solar cells.

The gases used in the CVD reactor may be either commercially available gases in tanks, such as Ar, $N_2$, $WF_6$, $SiH_4$, $B_2H_6$, $H_2$, and $NH_3$; liquids such as chlorides and carbonyls; or solids such as Mo carbonyl, which has a vapor pressure of 10 Pa (75 mtorr) at 20° C. and decomposes at temperatures greater than about 150° C. Vapor may also come from reactive bed sources where a flowing halide, such as chlorine, reacts with a hot-bed material, such as chromium or tantalum, to give a gaseous species.

Vapor from liquids can be put into the gas stream by bubbling the hydrogen or a carrier gas through the liquid or by using a hot surface to vaporize the liquid into the gas stream. Liquid precursors are generally metered onto a hot surface using a peristaltic pump and the gas handling system is kept hot to keep the material vaporized. In some cases, the vapor above a liquid may be used as the gas source.

Reactive bed sources use heated solid materials, e.g., chips and shavings, over which a reactive gas flows. The reaction produces a volatile gaseous species that can then be used as the precursor gas. By controlling the reaction bed parameters, the stoichiometry of the resulting gas can be controlled.

The morphology, composition, crystalline structure, defect concentration, and properties of CVD-deposited material depend on a number of factors. An important variable in the CVD reaction is the effect of vapor supersaturation over the substrate surface and the substrate temperature. At low supersaturations, which also give a low deposition rate, nuclei initiate on isolated sites and grow over the surface, giving a high density film. At high temperatures and low supersaturations of the vapor, epitaxial growth (oriented overgrowth) can be obtained on appropriate substrates. This vapor phase epitaxial (VPE) growth is used to grow doped layers of semiconductors, e.g., Si doped with B on Si. At intermediate concentrations, a nodular growth structure may form.

Many materials deposited by CVD have a high elastic modulus and a low fracture toughness and are therefore affected by residual film stresses. Film stress arises owing to the manner of growth and the coefficient of expansion mismatch between the substrate and film material. In many CVD processes, high temperatures are used. This restricts the substrate coating material combinations to ones where the coefficient of thermal expansions can be matched. High temperatures often lead to significant reaction between the deposited material and the substrate, which can also introduce stresses.

Processing variables that affect the properties of the thermal CVD material include the precursor vapors being used, substrate temperature, precursor vapor temperature gradient above substrate, gas flow pattern and velocity, gas composition and pressure, vapor saturation above substrate, diffusion rate through the boundary layer, substrate material, and impurities in the gases.

Safety is often a primary concern in CVD processing because of the hazardous nature of some of the gases and vapors that are used and the hot reaction products generated.

The density of CVD deposits is generally high (>99%), but dendritic or columnar growth can decrease the density. High purity films can be attained but incomplete decomposition of the precursor gases can leave residuals in the deposits particularly at low deposition temperatures. The CVD deposition process, is overall, relatively attractive, but the properties of the deposit often depend on deposition rate, gas flow impingement rate and direction. CVD deposition rates can range from less than 10 to more than 300 microns/hour and generally have no restriction on thickness. The thickness of a CVD deposit is determined by the processing parameters and can range from very thin films to thick coatings to free-standing shapes.

The microstructure and crystallographic texture of polysilicon deposited by LPCVD (usually involving the thermal decomposition of silane) is determined mainly by the deposition temperature and the partial pressure of the reactant gases (e.g. silane) and to a lesser extent the presence of hydrogen carrier gas. It is generally believed that at low deposition temperatures and high silane pressures, the deposited films are initially amorphous and subsequently crystallize, i.e. become devitrified. As the temperature is increased and the silane pressure decreased, the films become columnar or predominantly columnar with regimes of preferred orientation that change from (311) to (110) to (100) and finally to a random orientation at the highest temperatures and lowest pressures. At a typical silane pressure of 300 mtorr, films deposited below 580° C. are devitrified. At such pressures, films deposited at temperatures from 580° C. to 600° C. are predominantly columnar with a (311) texture. At the same pressures, films deposited at temperatures from 600° C. to 700° C. exhibit a (110) texture and a columnar microstructure on top of an initial equiaxed nucleation layer. And, at such pressures, films deposited above 700° C. are predicted to have a (100) texture and a columnar microstructure. However, these specific deposition parameters are only approximate and will vary between different deposition systems. For example, some researchers never encounter the (311) texture regime (that is the case for the preferred embodiment films deposited at 580° C. and described herein), while others have reported varying microstructures among films deposited on different wafers within the same furnace.

Previous reports have stated that any depositions below 580° C. will be amorphous. However, the present inventors have found that films deposited at 570° C. and 580° C. have devitrified microstructures, while films deposited at 550° C. are amorphous and generally remain amorphous unless heated during subsequent processing to temperatures of approximately 570° C. or above. It is likely that any pressure between about 100 to about 500 mtorr, similar trends will be observed. The present inventors currently believe that 570° C. may be the optimum temperature for forming the devitrified layers as described herein. This temperature is high enough so that the deposition rate is acceptable, and it is low enough that there should be no columnar nature to these layers. However, depending upon other process and system parameters, it is contemplated that deposition temperatures from about 550° C. to about 590° C. may be utilized to form the devitrified layers described herein. Deposition at any temperature between about 600° C. and about 700° C., preferably about 605° C. to about 650° C., and most preferably about 615° C., should result in a columnar, or at least predominantly columnar polysilicon film exhibiting compressive stress.

Preferably, during the deposition of the various layers in forming the multi-layer assembly, temperature adjusting equilibrium time periods are employed between deposition of the individual layers. This practice ensures that the substrate or partially formed multi-layer assembly is at a common and uniform temperature, and that the temperature is the desired deposition temperature. For example, if the temperature of the substrate or stack is at 570° C., and it is desired to deposit the next layer at 615° C., the temperature is ramped up to that temperature within a time period of about 25 minutes. Then, the next layer is deposited at the desired higher temperature, i.e. 615° C. After completion of the formation of that layer, if it is then desired to deposit another layer at a lower temperature, for instance, 570° C., another temperature adjusting time period is allowed to pass. In the case of having previously deposited a layer at 615° C. and desiring to next deposit a layer at 570° C., the present inventors have determined that a suitable temperature cooling period is about 30 minutes. The optimal temperatures and adjusting time periods may vary depending on the LPCVD equipment used.

As described herein, films deposited in the transition region between the amorphous and columnar regimes contain randomly oriented very small (~0.1 $\mu$m) crystallites. The devitrified microstructure is believed to arise from crystallization (via homogeneous nucleation) of the amorphous silicon film during the later stages of the deposition, or during subsequent heat treatment. This explanation is supported by observations that partially crystallized films are only crystallized at the bottom (substrate interface) region but amorphous at the external face (gas interface). Furthermore, slightly coarser devitrified microstructures result from fine-grained devitrified films which are subsequently annealed at elevated temperatures to induce grain coarsening.

Most importantly for microelectromechanical applications, these fine-grained devitrified polysilicon films exhibit tensile residual stresses, while the coarser polycrystalline columnar films deposited at higher temperatures exhibit compressive residual stresses. The tensile stresses in the fine-grained devitrified polysilicon are believed to result from the volume change during crystallization from the amorphous state. The compressive stresses in the polysilicon deposited at high temperatures are not well understood, though hydrogen incorporation has been postulated as part of the cause since the stresses in both the nucleation and columnar layers are similar. Relatively thick columnar films display a much rougher surface than fine-grained films, due to the semi-spherical morphology of the peaks of the individual columnar grains.

The present invention provides a novel technique of utilizing multiple layers of LPCVD or CVD polysilicon deposited at varying temperatures, such that a composite film is formed which is comprised of alternating tensile and compressive layers. Thin films of polysilicon having a generally devitrified structure and an inherent tensile stress may be formed by CVD of silane at a temperature of about 570° C. Thin films of polysilicon having a generally predominantly columnar structure and an inherent compressive stress may be formed by CVD of silane at a temperature of about 615° C. In this manner, if the thicknesses of each of the individual layers are appropriately controlled, the overall stress of the polysilicon may range between that of a tensile fine-grained layer and a compressive columnar layer. The present inventors have demonstrated this unique and remarkable discovery by forming multiple layer films having overall residual levels of stress of zero, or substantially so.

Figure 2:
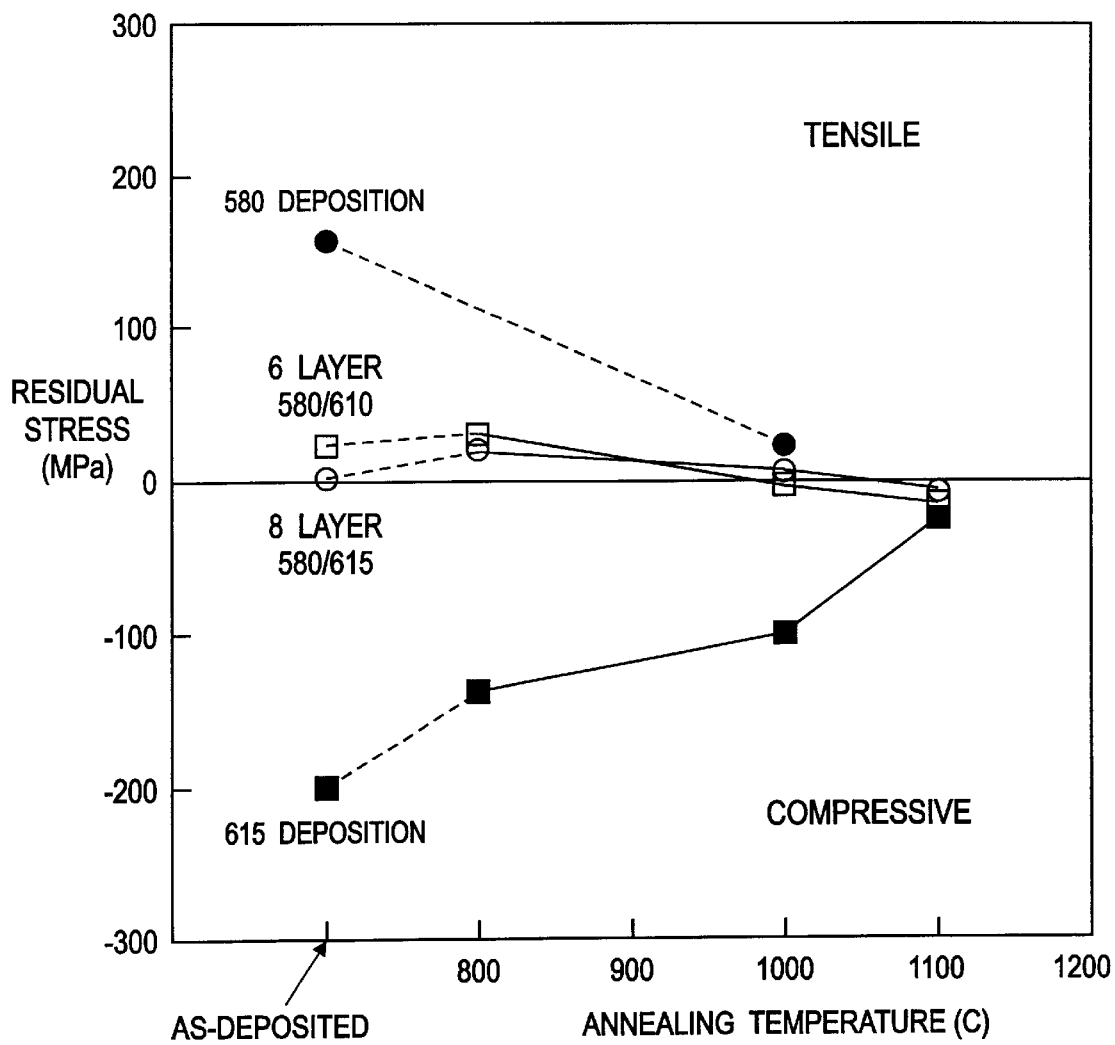
FIG. 2 is a graph illustrating stress in multi-layer polysilicon films as a function of temperature.

In accordance with the present invention, polysilicon films were deposited via LPCVD in a hot-walled furnace using silane at a pressure of 300 mtorr and a flow rate of 200 sccm at temperatures from 550° C. to 615° C. Some of the films were studied in the as-deposited state, while other films were annealed in flowing nitrogen for one hour at various temperatures. The stresses of the newly deposited and annealed films were measured as shown in FIG. 2 using a laser-reflected wafer curvature technique. The film deposited at 580° C. was at least partially crystalline as-deposited, as determined by x-ray diffraction and transmission electron microscopy (TEM) of cross-sectional samples, and was 5 microns thick, utilizing a deposition time of 1100 minutes. The film deposited at 615° C. was 5 microns thick, had a columnar microstructure, and utilized a deposition time of 600 minutes. A six layer film was deposited by varying the temperature in the furnace between 610° C. (for the odd layers) and 580° C. (for the even layers). While the temperature was ramping, the silane flow was stopped. The total thickness was 3.6 microns, using a deposition time of 194 minutes for each odd layer and 125 minutes for each even layer. An eight layer film was deposited in the same fashion as the six layer film, except that the even layers were deposited at 615° C. for 125 minutes each, and there were 2 additional layers. The total thickness was also 3.6 microns.

As seen in FIG. 2, the preferred embodiment polysilicon films deposited at 580° C. and 615° C. in accordance with the present invention, display tensile and compressive as-deposited residual stresses, respectively. The six layer film exhibits a low tensile stress, about 30 MPa, and the eight layer film exhibits a near-zero residual stress. Although annealing alters the stresses of the polysilicon films deposited at a single temperature, the near-zero stress state of the eight layer film is extremely stable up to 1000° C. Such stability demonstrates the immunity and resistance of the layered film to further process steps and enhances its value for microelectromechanical processing. The use of several (6 or 8) thin layers to create a thick film has an additional important advantage in that the procedure reduces the surface roughness by preventing columnar grains from developing rounded crests.

Figure 3:
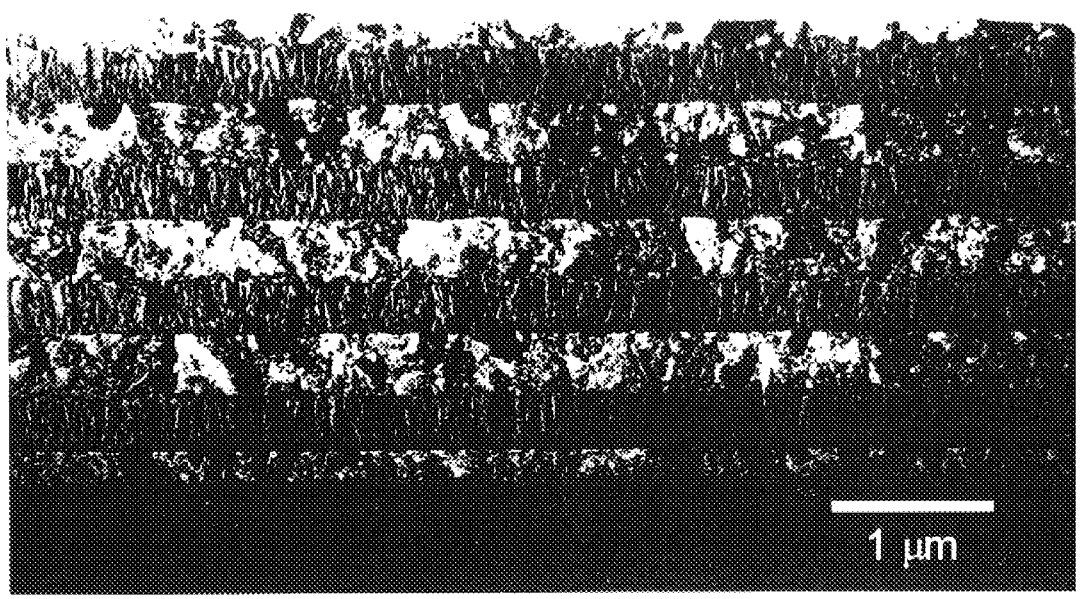
FIG. 3 is a transmission electron micrograph of a cross section of a preferred embodiment nine layer polysilicon film in accordance with the present invention.

FIG. 3 is a cross-sectional transmission electron micrograph of a preferred embodiment nine layer film in accordance with the present invention. The fine grained microstructures of the odd layers and the columnar microstructure of the even layers are apparent. Films with microstructures which are symmetric about the midpoint of the film thickness are expected to display zero residual stress gradients. It is significant that the multi-layer assembly shown in FIG. 3 does not require, and thus does not utilize, any type of intermediate layer(s) between the alternating layers of polysilicon.

Figure 4:
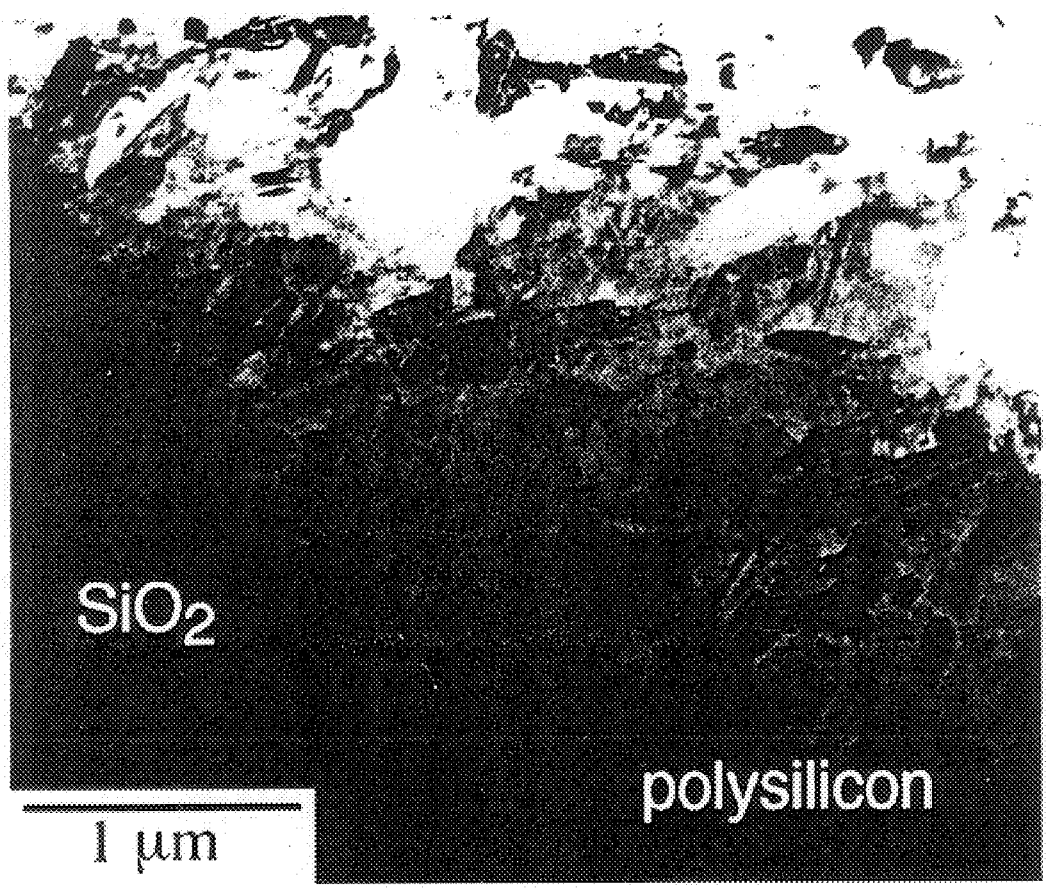
FIG. 4 is a transmission electron micrograph of a cross section of a preferred embodiment single, generally devitrified layer of polysilicon deposited at a temperature of 580° C.

Similarly, FIG. 4 is a transmission electron micrograph of a cross section of a preferred embodiment single, generally devitrified layer of polysilicon formed at 580° C. A neighboring region (shown on the left hand side of FIG. 4) of silicon dioxide is shown. FIG. 4 demonstrates that the process of devitrification is slightly slower than the rate of film growth or deposition.

Figure 5:
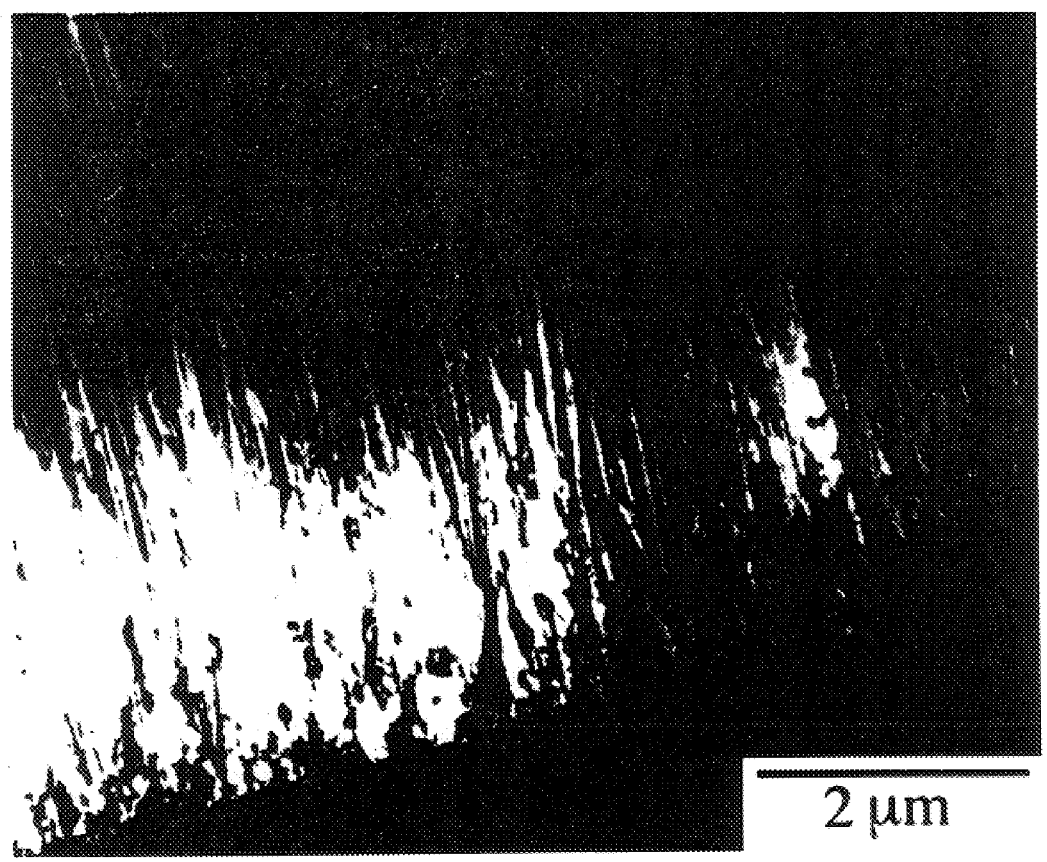
FIG. 5 is a transmission electron micrograph of a cross section of a preferred embodiment single, generally predominantly columnar layer of polysilicon deposited at a temperature of 615° C.

FIG. 5 is a transmission electron micrograph of a cross section of a preferred embodiment single, generally columnar layer of polysilicon formed at 615° C.

By using alternating layers of tensile and compressive polysilicon, films can be deposited and imparted with any stress value between those of the individual layers. This has been demonstrated with an eight layer film of near zero residual stress. Another aspect of the present invention is the influence of the multi-layer structure on the stress gradient.

As previously noted, it is generally preferred to form multi-layered assemblies that utilize an odd number of layers. This technique if properly executed, results in the canceling out of stress gradients. It may also be preferred to anneal the last layer that is deposited in order to impart the same stress characteristics as other layers within the assembly.

The present invention multi-layer polysilicon assembly may be used in a wide array of applications. Generally, any application that utilizes polysilicon as a mechanical material could benefit from the present invention. For examples, devices such as accelerometers, pressure sensors, and gyroscopes could utilize the present invention polysilicon multi-layer assemblies. Generally, the present invention provides improved stability, more predictable behavior and enables more precise design and engineering.

Another phenomenon related to the present invention relates to deposition of polysilicon at a specific temperature at the transition between the as-deposited amorphous and as-deposited crystalline regions. Such deposition leads to a polysilicon layer which is crystalline or columnar (compressive) at the bottom and amorphous (tensile) at the top. If performed properly, this could lead to an overall zero-stress film. However, this technique is extremely difficult to control. Other drawbacks of this technique are that it precludes any further processing at higher temperatures, and it can never produce a zero-stress gradient film. Therefore, this is an inferior strategy to the preferred embodiment of the present invention method described herein.

EXAMPLES

The following examples are provided to further illustrate various aspects of the present invention.

Example 1
Formation of a 3 Micron Thick Film With an Overall Stress of Zero and a Stress Gradient of Zero, Using 5 Layers After heating a suitable substrate, a 430 nm thick devitrified polysilicon layer is deposited at 570° C. The tensile stress of that layer, upon final formation, would be about 265 MPa. A heating period of about 25 minutes is then applied to raise the temperature of the substrate and layer to 615° C. Next, a 855 nm thick predominantly columnar polysilicon layer is deposited at 615° C. That layer exhibits a compressive stress of about 200 MPa. The resulting assembly is then cooled over the course of about 30 minutes. Then, a 430 nm thick devitrified polysilicon layer is deposited at 570° C. with a tensile stress of approximately 265 MPa. After a 25 minute heating period, a 855 nm thick predominantly columnar polysilicon layer is deposited at 615° C. with a compressive stress of about 200 MPa. After a cooling period, a 430 nm thick devitrified polysilicon layer is deposited at 570° C. with a tensile stress of about 265 MPa. The resulting multi-layer film is then preferably annealed at 615° C. for one hour to fully crystallize the last devitrified layer. It may in some applications be desirable to anneal for a longer time period such as 2 or more hours.

Example 2
Formation of a 4 Micron Thick Film With an Overall Stress of 100 MPa Tensile and a Stress Gradient of Zero, Using 7 Layers As previously described, after heating a substrate, a 484 nm thick devitrified polysilicon layer is deposited at 570° C. The tensile stress of that layer would be about 265 MPa. After an additional heating period, a 688 nm thick predominantly columnar polysilicon layer is deposited at 615° C. with a compressive stress of approximately 200 MPa. Then a 484 nm thick devitrified polysilicon layer is deposited at 570° C. with a tensile stress of about 265 MPa. Next, after a sufficient heating period, a 688 nm thick predominantly columnar polysilicon layer is deposited at 615° C. with a compressive stress of about 200 MPa. Next, after sufficient cooling, a 484 nm thick devitrified polysilicon layer at 570° C. with a tensile stress of 265 MPa. Then, a 688 nm thick predominantly columnar polysilicon layer is deposited at 615° C. with a compressive stress of about 200 MPa. Next, a 484 nm thick devitrified polysilicon layer is deposited at 570° C. with a tensile stress of 265 MPa. The resulting multi-layer film is annealed at 615° C. for one hour to fully crystallize the last devitrified layer.

Example 3
Formation of a 3.0 Micron Thick Film With an Overall Stress of 7 MPa Tensile, Using 9 Layers A first devitrified polysilicon layer is formed by silane deposition at 570° C., deposition occurring for 59 minutes. A 25 minute heating period is used to allow the substrate to reach a temperature of 615° C. Then, a 54 minute deposition period is used to form the second layer, a predominantly columnar layer. A 30 minute cooling period is used to allow the substrate and layers to cool to 570° C. Then, the third layer is formed by silane deposition for a period of 118 minutes at 570° C. The foregoing process is repeated to form layers 4 (54 minutes deposition at 615° C.), 5 (118 minutes deposition at 570° C.), 6 (54 minutes deposition at 615° C.), 7 (118 minutes deposition at 570° C.), and 8 (54 minutes deposition at 615° C.). The top and last layer, layer 9, is formed in a similar fashion as the first layer, layer 1. Layer 9 is preferably formed by using a deposition time period of 59 minutes at 570° C. It is instructive that the time period for deposition of the first and last layers is each about 59 minutes, which is one-half the deposition time for each of layers 3, 5, and 7. This provides for selectively producing an overall desired stress characteristic while also providing a relatively smooth outer finish,

Example 4
Formation of a 2.8 Micron Thick Film With an Overall Stress of 17 MPa Tensile, Using 9 Layers The same procedure may be utilized as previously described with regard to Example 3 with the exception that instead of utilizing a deposition time of 54 minutes for layers 2, 4, 6, and 8, a shorter time period of 51 minutes is employed.

Example 5
Formation of a 0.4 Micron Thick Film With an Overall Stress of 2 MPa Tensile, Using 3 Layers A first polysilicon layer is formed by silane deposition for 46 minutes at 550° C. Prior to this a 25 minutes heating period is utilized to ensure that the receiving substrate is at a uniform temperature of 550° C. After deposition of the first layer, another 25 minute heating period is employed to ensure that the assembly is at a temperature of 615° C. The second layer is then formed by silane deposition for 24 minutes at 615° C. Afterwards, a 30 minute cooling period is used to bring the assembly to a temperature of 550° C. The third layer is then formed by silane deposition for 46 minutes at 550° C. The resulting assembly is annealed for 2 hours at 615° C.

The present invention has been described with reference to the preferred embodiments. Obviously, modifications and alterations will occur to others upon a reading and understanding of the preceding detailed description. It is intended that the invention be construed as including all such alterations and modifications in so far as they are within the scope of the claims or the equivalents thereof. For example, it is contemplated by the present inventors that the techniques and strategies associated with the invention may be utilized when depositing nearly any type of material, and particularly in forming multi-layer stacked assemblies of thin films.

Having thus described the invention, it is now claimed:

1. A multi-layer thin film assembly comprising:
    a first thin film comprising polysilicon, said first thin film having a devitrified microstructure and an internal tensile stress; and
    a second thin film comprising polysilicon, said second thin film having a predominantly columnar microstructure and an internal compressive stress, wherein said first thin film is immediately adjacent said second thin film thereby avoiding the use of an intermediate layer between said first thin film and said second thin film.

2. The multi-layer assembly of claim 1 wherein said first thin film is deposited at a temperature of from about 550° C. to about 590° C.

3. The multi-layer assembly of claim 2 wherein said first thin film is deposited at a temperature of about 570° C.

4. The multi-layer assembly of claim 1 wherein said second thin film is deposited at a temperature of from about 600° C. to about 700° C.

5. The multi-layer assembly of claim 4 wherein said second thin film is deposited at a temperature of from about 605° C. to about 650° C.

6. The multi-layer assembly of claim 5 wherein said second thin film is deposited at a temperature of about 615° C.

7. The multi-layer assembly of claim 1 wherein the surface finish of said second thin film is less than about 25 nm.

8. The multi-layer assembly of claim 1 wherein the thickness of said first thin film ranges from about 100 nm to about 1000 nm.

9. The multi-layer assembly of claim 8 wherein the thickness of said second thin film ranges from about 100 nm to about 1000 nm.

10. The multi-layer assembly of claim 1 wherein the thickness of said multi-layer assembly is from about 1 micron to about 10 micron.

11. The multi-layer assembly of claim 1 further comprising:
    a third thin film comprising polysilicon, said third thin film having a devitrified microstructure and an internal tensile stress; and
    a fourth thin film comprising polysilicon, said fourth thin film having a predominantly columnar microstructure and an internal compressive stress, wherein said third thin film is immediately adjacent said fourth thin film and said second thin film, thereby avoiding the use of intermediate layers between said second thin film, said third thin film, and said fourth thin film.

12. The multi-layer assembly of claim 11 wherein the surface finish of said fourth thin film is less than about 25 nm.

13. The multi-layer assembly of claim 11 wherein the thickness of each of said third thin film and said fourth thin film ranges from about 100 nm to about 1000 nm.

14. The multi-layer assembly of claim 11 further comprising:
    a fifth thin film comprising polysilicon, said fifth thin film having a devitrified microstructure and an internal tensile stress; and
    a sixth thin film comprising polysilicon, said sixth thin film having a predominantly columnar microstructure and an internal compressive stress, wherein said fifth thin film is immediately adjacent said sixth thin film and said fourth thin film, thereby avoiding the use of intermediate layers between said fourth thin film, said fifth thin film, and said sixth thin film.

15. A multi-layer thin film assembly comprising:
    a first thin film comprising polysilicon and having a predominantly columnar microstructure, said first thin film having a thickness of from about 100 nm to about 1000 nm;
    a second thin film comprising polysilicon and having a devitrified microstructure and disposed immediately adjacent to said first thin film, said second thin film having a thickness of from about 100 nm to about 1000 nm; and
    a third thin film comprising polysilicon and having a predominantly columnar microstructure, said third thin film being disposed immediately adjacent to said second thin film, said third thin film having a thickness of from about 100 nm to about 1000 nm.

16. The multi-layer assembly of claim 15 wherein the surface finish of said third film is less than about 25 nm.

* * * * *